(12) United States Patent
Mutnury et al.

(10) Patent No.: US 10,292,266 B2
(45) Date of Patent: May 14, 2019

(54) SURFACE MOUNT CONNECTOR PAD

(71) Applicant: DELL PRODUCTS, LP, Round Rock, TX (US)

(72) Inventors: Bhyrav M. Mutnury, Austin, TX (US); Douglas S. Winterberg, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 15/963,625

(22) Filed: Apr. 26, 2018

(65) Prior Publication Data

US 2018/0317320 A1    Nov. 1, 2018

Related U.S. Application Data

(63) Continuation of application No. 15/456,083, filed on Mar. 10, 2017, now Pat. No. 9,980,378.

(51) Int. Cl.
*H05K 1/02* (2006.01)
*H05K 1/11* (2006.01)
*H05K 1/18* (2006.01)

(52) U.S. Cl.
CPC ......... *H05K 1/111* (2013.01); *H05K 1/0216* (2013.01); *H05K 1/181* (2013.01); *H05K 1/0228* (2013.01); *H05K 2201/10189* (2013.01); *Y02P 70/611* (2015.11)

(58) Field of Classification Search
CPC ... H05K 1/02; H05K 1/11; H05K 1/14; H05K 1/18; H01L 21/48; H01L 23/00; H01L 23/48

USPC .................. 174/261, 255, 257, 262; 324/686
See application file for complete search history.

(56) References Cited

U.S. PATENT DOCUMENTS

| | | | |
|---|---|---|---|
| 5,122,064 A | 1/1992 | Zarreii | |
| 5,147,209 A | 9/1992 | Litwin et al. | |
| 5,485,081 A | 1/1996 | Whitehead et al. | |
| 5,486,657 A | 1/1996 | Bell et al. | |
| 5,537,108 A | 7/1996 | Nathan et al. | |
| 6,069,323 A | 5/2000 | Slupek et al. | |
| 6,373,139 B1 | 4/2002 | Clark | |
| 6,916,995 B2 * | 7/2005 | Seaman | H01L 23/49816 174/255 |
| 2002/0017397 A1 * | 2/2002 | Ramey | H05K 1/117 174/255 |
| 2003/0003705 A1 | 1/2003 | Chung et al. | |

(Continued)

*Primary Examiner* — Xiaoliang Chen
(74) *Attorney, Agent, or Firm* — Larson Newman, LLP

(57) ABSTRACT

A circuit board includes first and second lines of surface mount pads, and a trace. The surface mount pads within the first line extend from a first edge of the circuit board toward a second edge of the circuit board. The surface mount pads within the second line extend from the first edge of the circuit board toward the second edge of the circuit board, and the surface mount pads within the second line are further from a third edge of the circuit board as compared to the surface mount pads within the first line. The trace is located on a top surface of the circuit board, and extends from the third edge to a fourth edge of the circuit board. The spacing between first adjacent surface mount pads within the first line enables the trace to be routed between the first adjacent surface mount pads with less crosstalk between signals on the trace and signals on the surface mount pads within the first line.

7 Claims, 4 Drawing Sheets

(56) References Cited

U.S. PATENT DOCUMENTS

2012/0212241 A1* 8/2012 Wallace .............. A63F 3/00643
324/686
2016/0240463 A1* 8/2016 Jow ................... H01L 23/49805
2016/0316562 A1* 10/2016 Mundt ................... H05K 1/114

* cited by examiner

SURFACE MOUNT CONNECTOR PAD

CROSS REFERENCE TO RELATED APPLICATION

This application is a continuation of U.S. patent application Ser. No. 15/456,083 entitled "Surface Mount Connector Pad," filed on Mar. 10, 2017, the disclosure of which is hereby expressly incorporated by reference in its entirety.

FIELD OF THE DISCLOSURE

The present disclosure generally relates to information handling systems, and more particularly relates to a surface mount connector pad.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A circuit board includes first and second lines of surface mount pads, and a trace. The surface mount pads within the first line extend from a first edge of the circuit board toward a second edge of the circuit board. The surface mount pads within the second line extend from the first edge of the circuit board toward the second edge of the circuit board, and the surface mount pads within the second line are further from a third edge of the circuit board as compared to the surface mount pads within the first line. The trace is located on a top surface of the circuit board, and extends from the third edge to a fourth edge of the circuit board. The spacing between first adjacent surface mount pads within the first line enables the trace to be routed between the first adjacent surface mount pads with less crosstalk between signals on the trace and signals on the surface mount pads within the first line.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
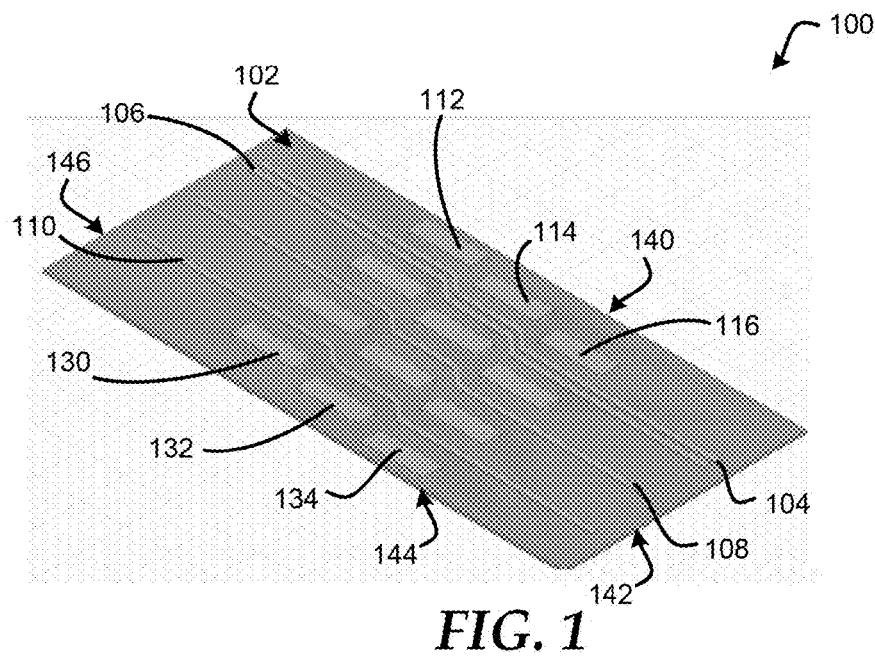
FIG. 1 is a perspective view of a first embodiment of a circuit board including multiple traces and surface mount pads according to at least one embodiment of the present disclosure.
Figure 2:
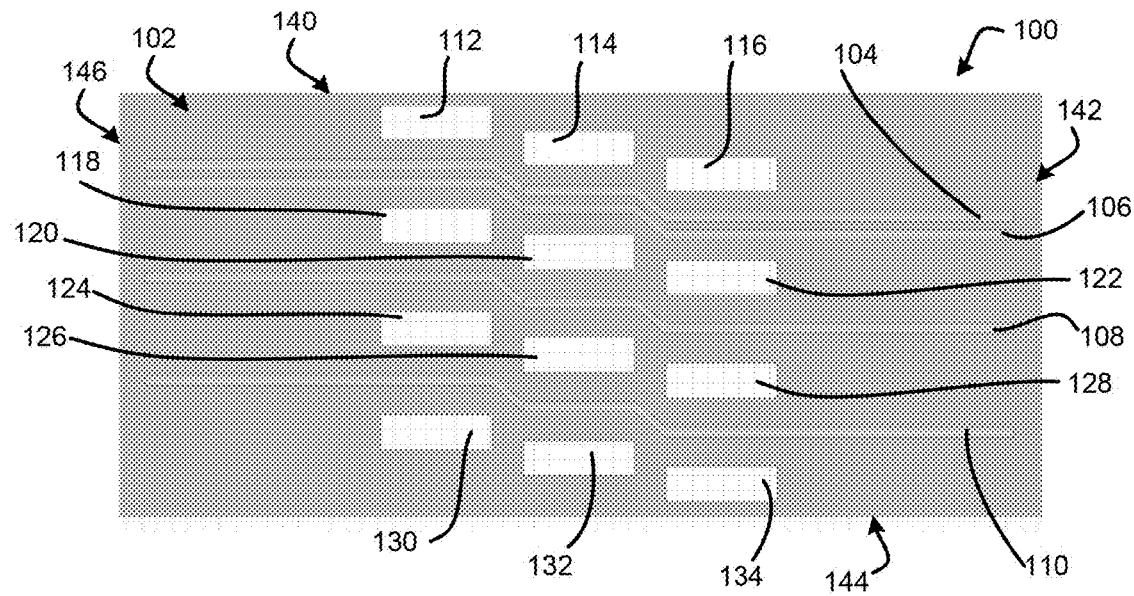
FIG. 2 is a top view of the first embodiment of the circuit board according to at least one embodiment of the present disclosure.

FIGS. 1 and 2 show a circuit board 100 of an information handling system. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more buses operable to transmit communications between the various hardware components.

FIG. 1 is a perspective view and FIG. 2 is a top view of a first embodiment of the circuit board 100 including a top surface 102, signal multiple traces 104, 106, 108, and 110, and multiple surface mount pads 112, 114, 116, 118, 120, 122, 124, 126, 128, 130, 132, and 134 according to at least one embodiment of the present disclosure. The top surface 102 can have edges 140, 142, 144, and 146. In an embodiment, edges 140 and 144 can be opposite each other, and edges 142 and 146 can be opposite each other. In an embodiment, the circuit board 100 can extend beyond edges 140, 142, 144, and 146 without varying from the scope of the disclosure. However, the discussion of the circuit board 100 will be described with respect to edges 140, 142, 144, and 146 for clarity of locations of components of the circuit board 100. In an embodiment, the surface mount pads 114, 120, 126, and 132 provide ground connections for a surface mount dual in-line memory module (DIMM), and the surface mount pads 112, 116, 118, 122, 124, 128, 130, and 134 provide signal connections for the DIMM.

In an embodiment, the surface mount pads 112, 114, and 116 are positioned in a diagonal line. For example, the surface mount pad 112 is nearest to both edges 140 and 146 of the pads 112, 114, and 116. The surface mount pad 114 is located in between the surface mount pads 112 and 116, and the surface mount pad 114 is located further from both edges 140 and 146 as compared to surface mount pad 112. The surface mount pad 116 is located furthest from both edges 140 and 146 and nearest to both of the edges 142 and 144 of the surface mount pads 112, 114, and 116.

In an embodiment, the surface mount pads 118, 120, and 122 are positioned in a diagonal line. For example, the surface mount pad 118 is nearest to both edges 140 and 146 of the pads 118, 120, and 122. The surface mount pad 120 is located in between the surface mount pads 118 and 122, and the surface mount pad 120 is located further from both edges 140 and 146 as compared to surface mount pad 118. The surface mount pad 122 is located furthest from both edges 140 and 146 and nearest to both of the edges 142 and 144 of the surface mount pads 118, 120, and 122.

In an embodiment, the surface mount pads 124, 126, and 128 are positioned in a diagonal line. For example, the surface mount pad 124 is nearest to both edges 140 and 146 of the pads 124, 126, and 128. The surface mount pad 126 is located in between the surface mount pads 124 and 128, and the surface mount pad 126 is located further from both edges 140 and 146 as compared to surface mount pad 126. The surface mount pad 128 is located furthest from both edges 140 and 146 and nearest to both of the edges 142 and 144 of the surface mount pads 130, 132, and 134.

In an embodiment, the surface mount pads 130, 132, and 134 are positioned in a diagonal line. For example, the surface mount pad 130 is nearest to both edges 140 and 146 of the pads 130, 132, and 134. The surface mount pad 132 is located in between the surface mount pads 130 and 134, and the surface mount pad 132 is located further from both edges 140 and 146 as compared to surface mount pad 130. The surface mount pad 134 is located furthest from both edges 140 and 146 and nearest to both of the edges 142 and 144 of the surface mount pads 130, 132, and 134.

In previous designs of a surface-mount technology circuit board, the surface mount pads would be located in two lines with each line extending from edge 140 to edge 144. In this previous implementation, the surface mount pads in each line would alternate between signal connection pads and ground connection pads. However, in the embodiment of FIGS. 1 and 2, the surface mount pads are located in three lines extending from edge 140 to edge 144. The line nearest to edge 146 includes surface mount pads 112, 118, 124, and 130, which all provide signal connections. The next line from edge 146 includes surface mount pads 114, 120, 126, and 132, which all provide ground connections. The line nearest to edge 142 includes surface mount pads 116, 122, 128, and 134, which all provide signal connections. Thus, in this embodiment, the surface mount pads 114, 120, 126, and 132 that provide ground connections are not located in the same line as pads that provide signal connection as found in previous surface-mount technology circuit boards. Each of lines of surface mount pads in previous implementations would have twice the number of pads as compared to the number of surface mount pads in the embodiment of FIGS. 1 and 2.

Thus, the surface mount pads 114, 120, 126, and 132 providing ground connection being located in between the surface mount pads, which provide signal connections, allows room between the surface mount pads for traces on the surface 102 of the circuit board 100. For example, the traces 104 and 106 is routed on the surface 102 in between surface mount pads 112 and 118, in between surface mount pads 114 and 120, and in between surface mount pads 116 and 122. Similarly, the trace 108 is routed on the surface 102 in between surface mount pads 118 and 124, in between surface mount pads 120 and 126, and in between surface mount pads 122 and 128. The trace 110 can be routed on the surface 102 in between surface mount pads 124 and 130, in between surface mount pads 126 and 132, and in between surface mount pads 128 and 134.

The traces 104, 106, 108, and 110 are single ended traces that are more sensitive to crosstalk from the signals provided by the surface mount pads as compared to differential signals. The amount of crosstalk between signals on the traces 104, 106, 108, and 110 and the signals on the surface mount pads 112, 116, 118, 122, 124, 128, 130, and 134 can increase even more when the signaling speeds on the traces exceed 3.2 Gbps. Thus, with dual data rate 5 (DDR5) signaling technology having signaling speeds that would reach 6.4 Gbps the signals on traces in previous implementations would be affected even more by crosstalk. Thus, in previous implementations the surface mount pads where too close together to enable single ended traces to be routed between the pads on a top surface of the circuit board. Instead, the traces would be routed on another layer of the circuit board. However, the spacing between the surface mount pads 114, 116, 118, 120, 124, 126, 128, 130, 132, and 134 as shown in FIGS. 1 and 2 allows the traces 104, 106, 108, and 110 to be routed on the surface 102 without these signals on these traces experiencing a high amount of crosstalk from the signals on the surface mount pads.

Figure 3:
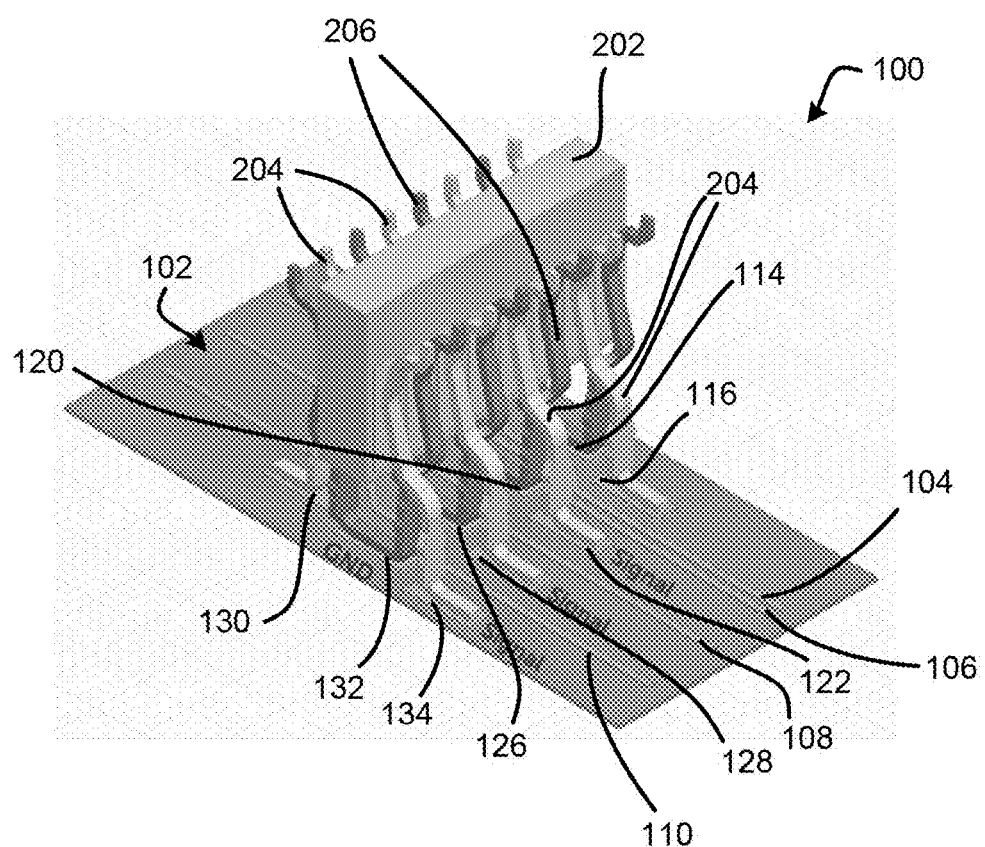
FIG. 3 is a perspective view of the first embodiment of the circuit board and a dual in-line memory module connected to the surface mount pads according to at least one embodiment of the present disclosure.

FIG. 3 is a perspective view of the first embodiment of the circuit board 100 and a dual in-line memory module (DIMM) 202 according to at least one embodiment of the present disclosure. The DIMM 202 includes multiple signal connector pins 204 and multiple ground connector pins 206. The circuit board 100 shown in FIG. 3, preferably includes the same surface mount pads in the same layout configuration as described above with respect to FIGS. 1 and 2. For example, the circuit board includes the surface mount pads 114, 120, 126, and 132 providing ground connections on the surface 102 of the circuit board 100. The surface mount pads 116, 122, 128, 130, and 128 providing signal connections can be seen in FIG. 3.

The pins 204 and 206 of the DIMM 202 can be placed in physical communication with and mounted on the surface mount pads circuit board 100. In particular, two ground connector pins 206 can connect with a single the surface mount pad providing a ground connection, and a single signal connector pin 204 can connect with a single surface mount pad providing a signal connection. For example, a ground connector 204 on a first side and a ground connector 204 on a second side of the DIMM 202 both can connect with surface mount pad 132 to provide a ground connection for signals on both signal connector pins 204 on both sides on the DIMM 202.

As described above, the space between the surface mount pads can enable the traces 104, 106, 108, and 110 to be routed in between the surface mount pads on the surface 102. The placement of the surface mount pads 114, 120, 126, and 132 providing ground connections at the center of the circuit board 100 can provide spacing for the traces 104, 106, 108, and 110 on surface 102 and can also provide shielding for signals on the traces that are located on either side of a pad. This positioning of the surface mount pads can also enable routing on the surface 102 without adding cost to the circuit board 100 by increasing the layer count.

Figure 4:
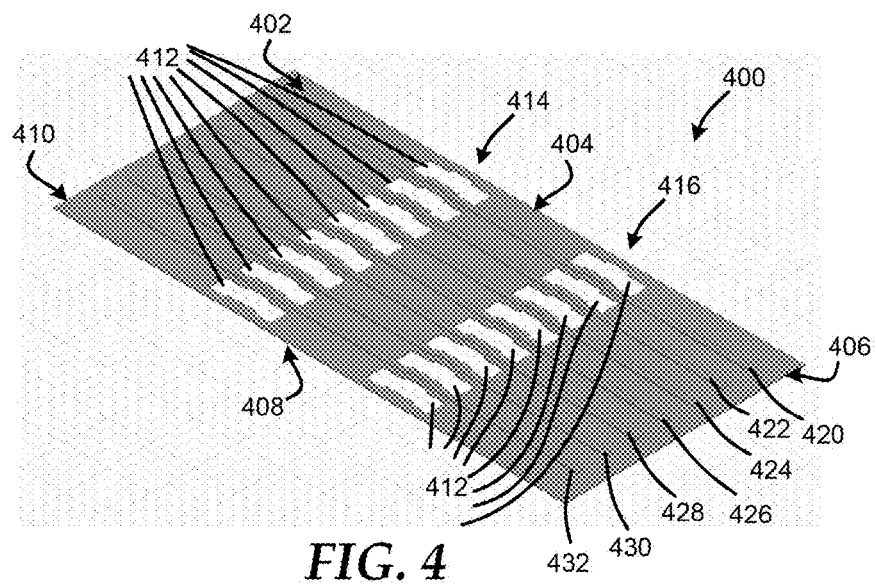
FIG. 4 is a perspective view of a second embodiment of the circuit board including multiple traces and surface mount pads according to at least one embodiment of the present disclosure.

FIG. 4 is a perspective view of a second embodiment of the circuit board 400 including a top surface 402, and edges 404, 406, 408, and 410 according to at least one embodiment of the present disclosure. In an embodiment, the circuit board 400 can extend beyond edges 404, 406, 408, and 410 without varying from the scope of the disclosure. However, the discussion of the circuit board 100 will be described with respect to edges 404, 406, 408, and 410 for clarity of locations of components of the circuit board 400. The circuit board 400 also includes multiple surface mount pads 412, which are located in two lines 414 and 416 across the circuit board 400. The circuit board 400 also includes traces 420, 422, 424, 426, 428, 430, and 432 routed on the top surface 402 of the circuit board.

In an embodiment, the lines 414 and 416 extend from edge 404 to edge 406. In an embodiment, the line 414 of surface mount pads 412 is located closer to edge 410 and the line 416 is located closer to edge 406. In an embodiment, the surface mount pads 412 within line 414 can alternate between signal connection pads and ground connection pads. For example, the surface mount pad 412 nearest to edge 404 can provide a signal connection, the pad 412 next in line from edge 404 can provide a ground connection, the next pad 412 can provide a signal connection, and this pattern can continue until the opposite edge 408. The surface mount pads 412 within line 416 can also alternate between signal connection pads and ground connection pads as described for line 414 with the pad nearest the edge 404 providing a signal connection.

Figure 5:
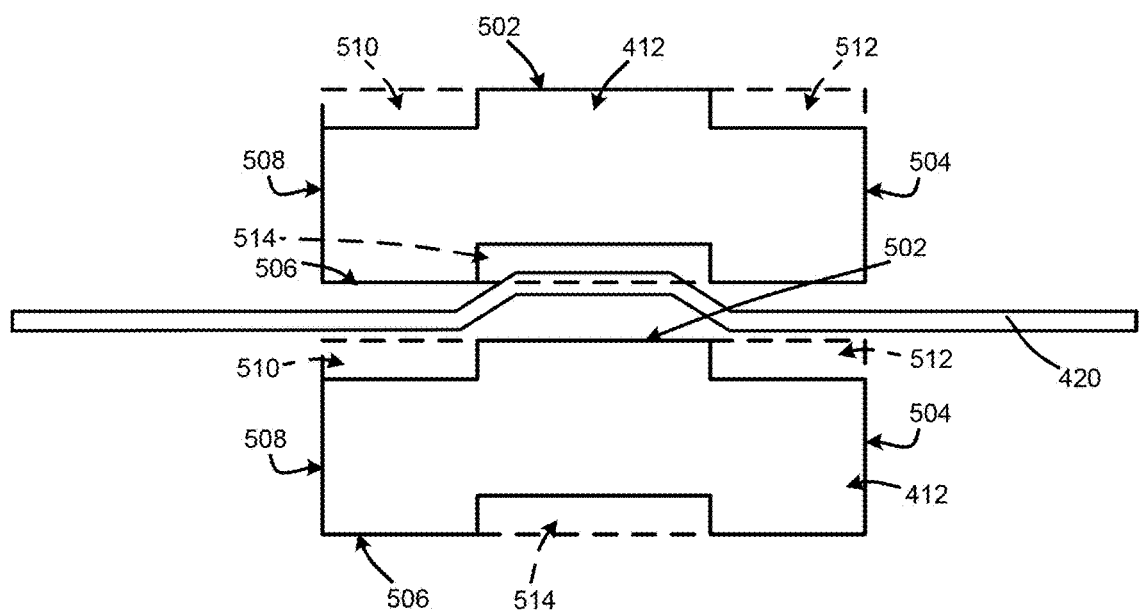
FIG. 5 is a block diagram of two surface mount pads of the second embodiment of the circuit board according to at least one embodiment of the present disclosure.

In an embodiment, portions of each surface mount pad 412 can be removed as compared to the surface mount pads of FIGS. 1-3 as shown in FIG. 5. FIG. 5 illustrates two surface mount pads 412 of the circuit board 400 according to at least one embodiment of the present disclosure. Each of the surface mount pads 412 can have edges 502, 504, 506, and 508 as shown in FIG. 5. Each surface mount pad 412 can have portions 510, 512, and 514 removed from a previous footprint of the pad 412. In an embodiment, the portion 510 can be rectangular with a starting point at the intersection of edge 502 and 508 and extend a first predetermined length along edge 502 away from edge 508, and can also extend a second predetermined length along edge 508 away from edge 502. In an embodiment, the portion 512 can also be rectangular with a starting point at the intersection of edge 502 and 504 and extend a first predetermined length along edge 502 away from edge 504, and can also extend a second predetermined length along edge 504 away from edge 502. In an embodiment, the portion 514 can be rectangular centered along edge 506 and can extend a first predetermined length along edge 504, and can also extend a second predetermined length into the footprint of the pad 412 toward edge 502. In an embodiment, the portion 514 of one surface mount pad 412 is complementary to the portions 510 and 512 of an adjacent surface mount pad 412.

The removal of portions 510, 512, and 514 from each of the surface mount pads 412 can enable more space between the pads 412 to route traces, such as trace 420 shown in FIG. 5, in between the pads 412 as compared to previous implementations without the portions removed from the footprint of the pads 412. For example, the trace 420 can be further from the edges of the surface mount pads 412 without portions 510 and 512 being located within one pad 412 and without portion 506 being located within the adjacent pad 412 as compared to if both pads had a complete rectangular footprint.

Referring back to FIG. 4, each of the surface mount pads 412 can shaped as described above with respect to FIG. 5 and used herein this pattern of the surface mount pads 412 will be referred to a checkered pattern. Thus, the checkered pattern of the surface mount pads 412 on the top surface 402 of the circuit board 400 can allow the traces 420, 422, 424, 426, 428, 430, and 432 to be routed from edge 406 to edge 410 in between the surface mount pads 412.

In an embodiment, the traces 420, 422, 424, 426, 428, 430, and 432 are single ended traces that are more sensitive to crosstalk from the signal provided by the surface mount pads as compared to differential signals. The amount of crosstalk between signals on the trace traces 420, 422, 424, 426, 428, 430, and 432 and signals through the pads 412 can increase even more when the signaling speeds on the traces exceed 3.2 Gbps. Thus, with DDR5 signaling technology having signaling speeds that would reach 6.4 Gbps the traces in previous implementations would be affected even more by crosstalk. Thus, in previous implementations the surface mount pads where too close together to enable single ended traces to be routed between the pads on a top surface of the circuit board. Instead, the traces would be routed on another layer of the circuit board. However, the spacing between the surface mount pads 412 as shown in FIG. 4 allows the traces 420, 422, 424, 426, 428, 430, and 432 to be routed on the top surface 402 without signals on these traces experiencing a high amount of crosstalk from the signals on the surface mount pads 412.

Figure 6:
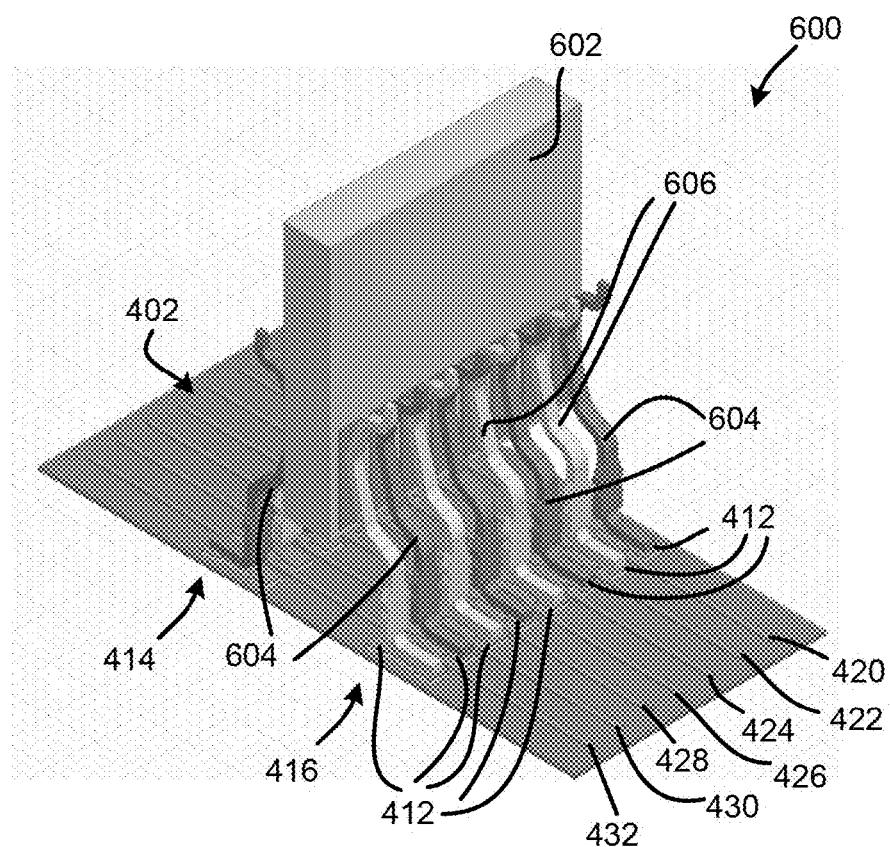
FIG. 6 is a perspective view of the second embodiment of the circuit board and a dual in-line memory module connected to the surface mount pads according to at least one embodiment of the present disclosure.

FIG. 6 is a perspective view of the second embodiment 600 of a circuit board and a DIMM 602 according to at least one embodiment of the present disclosure. The DIMM 602 includes multiple signal connector pins 604 and multiple ground connector pins 606. The circuit board 600 shown in FIG. 6, preferably includes the same surface mount pads 412 in the same layout configuration as described above with respect to FIGS. 4 and 5. For example, the circuit board includes the surface mount pads 412 in two lines 414 and 416 on the surface 402 of the circuit board 600.

The pins 604 and 606 of the DIMM 602 can be placed in physical communication with and mounted on the surface mount pads 412 of circuit board 600. In an embodiment, the checkered pattern of the mounting pads 412 can ensure that the pins 604 and 606 of the DIMM 602 can always mate with the proper pads 412 to ensure no opens in the connector pins 604 and 606 of in the surface mounting pads 412. As described above, the space between the surface mount pads 412 can enable the traces 420, 422, 424, 426, 428, 430, and 432 to be routed in between the surface mount pads 412 on the surface 402 without an increase in crosstalk between the signals on the traces and the signals from the connector pins 604 to the surface mount pads 412. This checkered pattern of the surface mount pads 412 can also enable routing on the surface 402 without adding cost to the circuit board 600 by increasing the layer count.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality.

The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A circuit board comprising:
a first line of surface mount pads, wherein the surface mount pads within the first line alternate between a first connection type and a second connection type;
a second line of surface mount pads, wherein the surface mount pads within the second line alternate between the first connection type and the second connection type, wherein the surface mount pads within the first and second lines form a checkered pattern on a top surface of the circuit board; and
a trace on a top surface of the circuit board, the trace extending across the circuit board, wherein a layout configuration of the surface mount pads within the first and second lines enables the trace to be routed between the surface mount pads within the first line with less crosstalk between signals on the trace and signals on the surface mount pads within the first line.

2. The circuit board of claim 1 wherein the checkered pattern is formed by a first surface mount pad within the first line having a first portion of a first edge of a footprint of the first surface mount pad being removed, and by a second surface mount pad within the first line having second and third portions of a second edge of a footprint of the second surface mount pad being removed.

3. The circuit board of claim 2 wherein the first edge of the first surface mount pad is adjacent to the second edge of the second surface mount pad.

4. The circuit board of claim 3 wherein the first portion of the first edge of the first surface mount pad is complementary to the second and third portions of the second edge of the second surface mount pad.

5. The circuit board of claim 2 wherein the checkered pattern is further formed by the second surface mount pad within the first line having a fourth portion of a third edge of the footprint of the second surface mount pad being removed, and by a third surface mount pad within the first line having fifth and sixth portions of a fourth edge of a footprint of the third surface mount pad being removed.

6. The circuit board of claim 5 wherein the third edge of the second surface mount pad is adjacent to the fourth edge of the third surface mount pad.

7. The circuit board of claim 6 wherein the fourth portion of the third edge of the second surface mount pad is complementary to the fifth and sixth portions of the fourth edge of the fourth surface mount pad.

* * * * *